(12) United States Patent
Twitto et al.

(10) Patent No.: US 9,105,339 B2
(45) Date of Patent: Aug. 11, 2015

(54) METHODS OF DRIVING A MEMORY

(71) Applicant: Samsung Electronics, Co., Ltd., Suwon-si (KR)

(72) Inventors: Moshe Twitto, Gan (IL); Jun-Jin Kong, Yong-in (KR)

(73) Assignee: Samsung Electronics Co., Ltd. (KR)

( * ) Notice: Subject to any disclaimer, the term of this patent is extended or adjusted under 35 U.S.C. 154(b) by 205 days.

(21) Appl. No.: 13/799,554

(22) Filed: Mar. 13, 2013

(65) Prior Publication Data

US 2013/0301353 A1 Nov. 14, 2013

(30) Foreign Application Priority Data

May 14, 2012 (KR) ........................ 10-2012-0051011

(51) Int. Cl.
*G11C 16/16* (2006.01)
*G11C 16/10* (2006.01)
*G11C 16/34* (2006.01)

(52) U.S. Cl.
CPC ................ *G11C 16/16* (2013.01); *G11C 16/10* (2013.01); *G11C 16/3445* (2013.01)

(58) Field of Classification Search
CPC ....................................................... G11C 16/16
USPC ........................... 365/185.09, 185.11, 185.33
See application file for complete search history.

(56) References Cited

U.S. PATENT DOCUMENTS

| 7,468,926 | B2 |   | 12/2008 | Shappir et al. |
| 7,564,711 | B2 | * | 7/2009 | Mokhlesi ................ 365/185.03 |
| 7,743,203 | B2 | * | 6/2010 | France .......................... 711/103 |
| 7,855,913 | B2 | * | 12/2010 | Fernandes ................ 365/185.03 |
| 7,944,755 | B2 | * | 5/2011 | Sarin ........................ 365/185.22 |
| 8,553,468 | B2 | * | 10/2013 | Sabbag et al. ............ 365/185.29 |

FOREIGN PATENT DOCUMENTS

| JP | 2001-093287 | 4/2001 |
| JP | 2006-114108 | 4/2006 |
| JP | 2009-151937 | 7/2009 |
| JP | 2010-108522 | 5/2010 |
| KR | 1020020001251 | 1/2002 |
| KR | 100721623 | 5/2007 |
| KR | 1020080096062 | 10/2008 |
| KR | 1020100097964 | 9/2010 |

* cited by examiner

*Primary Examiner* — Hoai V Ho
*Assistant Examiner* — Tri Hoang
(74) *Attorney, Agent, or Firm* — Myers Bigel Sibley & Sajovec, P.A.

(57) ABSTRACT

Methods of driving a memory include erasing a plurality of memory cells of a memory device, testing whether the memory cells have been erased, and programming the memory cells without erasing the memory cells again if more than a predetermined percentage of the memory cells, but less than all of the memory cells, were successfully erased.

18 Claims, 8 Drawing Sheets

Fig. 12

METHODS OF DRIVING A MEMORY

RELATED APPLICATION

This application claims priority under 35 U.S.C. §119 from Korean Patent Application No. 10-2012-0051011, filed on May 14, 2012, the disclosure of which is hereby incorporated by reference herein as if set forth in its entirety.

BACKGROUND

1. Field of the Inventive Concept

The present inventive concept relates to methods of driving a memory.

2. Description of the Related Art

Memory devices generally include volatile memory devices and nonvolatile memory devices. Volatile memory devices may lose data when the power supply is turned off, while nonvolatile memory devices may retain data for some period of time even when the power supply is turned off. Examples of the nonvolatile memory devices include read-only memories (ROMs), electrically erasable programmable read-only memories (EEPROMs), and flash memories.

Endurance and retention are concepts that relate to data integrity in a memory device. Endurance concerns the number of program/erase (P/E) cycles that a memory device can endure while storing data reliably, and retention relates to the length of time for which data can be reliably stored.

A reduction in geometry and/or an increase in the number of levels per memory cell affect endurance and/or retention. For example, while a single-level cell NAND flash memory can guarantee 100,000 P/E cycles, a multi-level cell NAND flash memory may guarantee only 10,000 P/E cycles.

The most destructive operation in a NAND flash memory is the block erase operation. In a block erase operation, for example, a very high negative voltage may be applied to a bulk contact of the memory device, and a control gate may be maintained at a voltage of zero. Accordingly, electric charge stored in a floating gate may be removed.

SUMMARY

Aspects of the present inventive concept provide a method of driving a memory, the method employed to increase endurance of the NAND flash memory.

However, aspects of the present inventive concept are not restricted to the embodiments described herein. The above and other aspects of the present inventive concept will become more apparent to one of ordinary skill in the art to which the present inventive concept pertains by referencing the detailed description of the present inventive concept given below.

According to some aspects of the present inventive concept, there is provided a method of driving a memory, including erasing a plurality of memory cells of a memory device, testing whether the memory cells have been erased, and not erasing the memory cells again if more than a predetermined percentage of the memory cells have been erased. If less than the predetermined percentage of the memory cells have been erased, the memory cells may be erased again.

Some aspects of the inventive concept provide a method of driving a memory device including erasing a plurality of memory cells of the memory device, checking whether the memory cells have been erased, determining that more than a predetermined percentage of the memory cells but less than all of the memory cells were erased, and programming data into the memory cells of the memory device without performing an intervening erase operation on the plurality of memory cells in response to the determination that more than the predetermined percentage of the memory cells but less than all of the memory cells were erased.

Some further aspects of the inventive concept provide a method of driving a memory device including applying an erase voltage to erase a plurality of memory cells of the memory device, wherein the erase voltage has a pulse time and/or a voltage level than is selected to erase upper voltage distribution levels of the plurality of permissible programmed voltage distribution levels but not to erase lower voltage distribution levels of the plurality of permissible programmed voltage distribution levels; and programming data into the upper voltage distribution levels of the memory cells after applying the erase voltage.

BRIEF DESCRIPTION OF THE DRAWINGS

The above and other aspects and features of the present inventive concept will become more apparent by describing in detail exemplary embodiments thereof with reference to the attached drawings, in which.

The above and other features and advantages of the present invention will become more apparent by describing in detail exemplary embodiments thereof with reference to the attached drawings in which:

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A flash memory device will hereinafter be described as an example of a nonvolatile memory device in which embodiments of the invention may be used. However, the nonvolatile memory device is not limited to flash memory devices.

Figure 1:
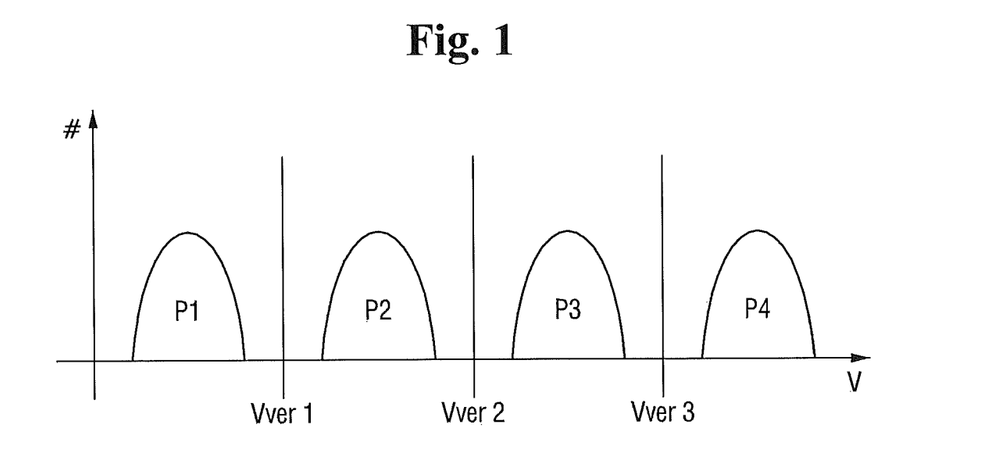
FIGS. 1 through 3 are diagrams illustrating a method of driving a memory according to an embodiment of the present inventive concept.
Figure 2:
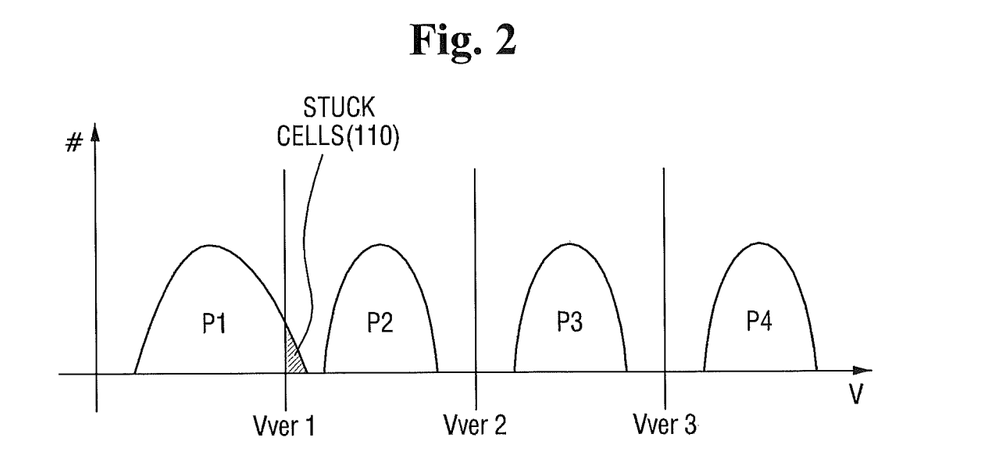
Figure 3:
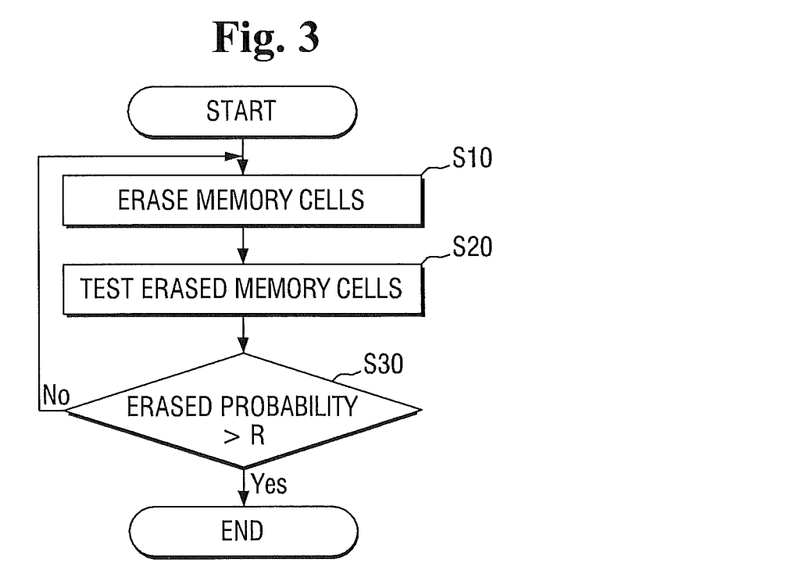

FIGS. 1 through 3 are diagrams illustrating methods of driving a memory device according to some embodiments of the present inventive concept.

Referring to FIG. 1, four voltage distributions are illustrated as an example. In FIG. 1, the x-axis represents voltage, and the y-axis represents the number of memory cells under consideration. That is, FIG. 1 is a histogram showing the distribution of gate voltages of a number or memory cells under consideration. The four voltage distributions may be first through fourth voltage distributions P1 through P4. Here, the first voltage distribution P1 may be an erased state. Three verification voltages Vver1 through Vver3 may divide the four voltage distributions P1 through P4. Levels of the three verification voltages Vver1 through Vver3 shown in FIG. 1 are merely an example, and the present inventive concept is not limited to this example.

In FIG. 1, only four voltage distributions are illustrated for the sake of simplicity. However, the number of voltage distributions can be expanded to K (where K is a natural number equal to or greater than two) voltage distributions.

Referring to FIGS. 2 and 3, methods of driving a memory according to some embodiments of the present inventive concept may use probabilistic erase (or light erase) as described in more detail herein.

It may be assumed that memory cells are erased on a memory block-by-memory block basis and that all memory cells in a memory block should be erased until the end of an erase operation. If not all memory cells in the memory block are to be erased, the intensity or application time of an erase bias may be increased. Such a change in the erase bias may damages channel insulating films of the memory cells and may reduce the achievable number of program/erase (P/E) cycles.

On the other hand, methods of driving a memory according to some embodiments of the present inventive concept utilize a probabilistic erase. That is, not all memory cells in a memory block have to be erased by the end of an erase operation.

Specifically, referring to FIG. 3, a plurality of memory cells of a memory device are erased (operation S10).

For example, a negative voltage at an appropriate level may be applied to a bulk contact of a plurality of memory cells (e.g., flash memory cells), and a voltage of zero may be applied to a gate of each of the memory cells. Since memory cells in one memory block share a bulk contact, they can be erased simultaneously by applying a negative voltage to the bulk contact.

In the drawings, voltage distributions of the memory cells change from the second through fourth voltage distributions P2 through P4 to the first voltage distribution P1.

The memory cells are tested to determine if they have been erased (operation S20).

Specifically, the voltage distributions of the memory cells are tested to determine if they correspond to the first voltage distribution P1. For example, it is identified whether the voltage distributions of the memory cells are smaller than the verification voltage Vver1.

Here, voltage distributions of some of the memory cells may be smaller than the verification voltage Vver1 (that is, erase success), and voltage distributions of other ones of the memory cells may be greater than the verification voltage Vver1 (that is, erase failure).

Based on the test result, it is identified whether more than a predetermined percentage R of the memory cells have been erased (operation S30).

That is, the percentage of successfully erased memory cells in all memory cells is compared with the predetermined percentage R. In other words, it is identified whether more than a predetermined number of memory cells in a memory block have been erased.

If the percentage of successfully erased memory cells in all memory cells is smaller than the predetermined percentage R, all memory cells are erased again.

On the other hand, if the percentage of successfully erased memory cells in all memory cells is greater than the predetermined percentage R, the erase operation is terminated without the re-erasing of all memory cells even when not all memory cells in a memory block have been erased. In this case, memory cells that have not been completely erased as of the termination of the erase operation are referred to as stuck cells 110.

The predetermined percentage R may be determined by a manufacturer or a user. That is, the manufacturer of a memory may determine a base percentage of probabilistic erase in advance (that is, the base percentage may be set by default). Alternatively, the user of the memory may set or change the base percentage through programming. A "light" erase procedure as described herein can be conducted inside a flash memory without intervention by the memory controller. In that case, the value of R is determined by the flash memory manufacturer.

The base percentage may be determined in view of the number of memory cells that can be corrected using error correction coding (ECC). Data stored in the stuck cells 110 may be processed as data generated by random errors. Therefore, data read from the stuck cells 110 can be corrected using error correction coding.

In methods of driving a memory according to some embodiments, if more than a predetermined percentage of memory cells are erased, a re-erase operation is not performed. Therefore, there is no need to increase the intensity and/or application time of a negative voltage used in an erase operation. Accordingly, this can reduce damage to channel insulating films of memory cells, increase the achievable number of P/E cycles, and/or increase the endurance of a memory device. In addition, since an erase voltage does not need to be applied multiple times, the erase time may be reduced.

Hereinafter, the erasing time required in a first case in which all memory cells must be erased as of the end of an erase operation and the erasing time required in a second case in which it is acceptable if only a predetermined number or percentage of memory cells are erased as of the end of an erase operation (i.e., a probabilistic erase) will be compared. For ease of description, it may be assumed that each memory cell has two voltage distributions, e.g., P1 and P2.

In addition, it may be assumed that $t_i$ is the time required to change from P2 to P1 when an erase voltage of $V_E$ is applied. While a value of $t_i$ is different for each memory cell, it may be a memory cell-independent value and may be determined by some parameters below. The value may be written as $T_i$ and treated as a random variable.

In the case where 'all memory cells must be erased until the end of an erase operation,' the time $Z_N$ required for block erase may be a random variable, where N is the number of cells in a memory block. That is, $$Z_N = \max_{1 \le i \le N} \{T_i\}.$$

Since the erase time depends on outputs of various parameters, a Gaussian distribution of $T_i$ can be modeled according to a central limit theorem. $T_i$ can be expressed by an average $\mu$ and a standard deviation $\sigma$. When N is very large, $Z_N$ follows a Gumbel distribution as given by Equation (1). $a_N$ and $b_N$ are appropriate normalization constants. In addition, the average and variance are as shown in Equation (2). $\gamma$ is an Euler constant.

$$f_{Z_N}(z) = \frac{1}{b_N} e^{-\frac{z-a_N}{b_N}} e^{-e^{-\frac{z-a_N}{b_N}}} \quad [1]$$

$$E[Z_N] = a_N + \gamma b_N \quad [2]$$

$$E[(Z_N - E[Z_N])^2] = \frac{1}{6}\pi^2 b_N^2$$

The following result can be obtained from Equations (1) and (2). Here, if Q(t) is a cumulative distribution function, $$F(t) = 1 - Q\left(\frac{t-\mu}{\sigma}\right).$$

$$a_N = F^{-1}\left(1 - \frac{1}{N}\right)$$

$$b_N = F^{-1}\left(1 - \frac{1}{Ne}\right) - a_N$$

If Q(t) is approximated, it can be expressed as $$Q(t) \approx e^{-\frac{t^2}{2}},$$

and Equation (3) can be obtained.

$$a_N \approx \mu + \sqrt{2\ln N}\sigma$$

$$b_N \approx \mu + \sqrt{2(\ln N+1)}\sigma - \mu + \sqrt{2\ln N}\sigma = (\sqrt{2(\ln N+1)} - \sqrt{2\ln N})\sigma \quad [3]$$

In addition, if $b_N$ is simplified, Equation (4) can be obtained.

$$(\sqrt{2(\ln N + 1)} - \sqrt{2\ln N})\sigma = \frac{\sqrt{2}\sigma}{\sqrt{(\ln N + 1)} + \sqrt{\ln N}} \le \frac{\sqrt{2}\sigma}{2\sqrt{\ln N}} = \frac{\sigma}{\sqrt{2\ln N}} \quad [4]$$

Ultimately, Equations (1) through (4) can be rearranged into Equation (5).

$$E[Z_N] = \mu + \left(\frac{2\ln(N) + \gamma}{\sqrt{2\ln N}}\right)\sigma \quad [5]$$

$$E[(Z_N - E[Z_N])^2] = \frac{\pi^2}{12\ln N}$$

In Equation (5), if N is infinite, the distribution approximates to a delta distribution, and its value (average) is given by Equation (6).

$$E[Z_N] = \mu + \sqrt{2\ln N}\sigma \quad [6]$$

The average erase time in probabilistic erase is calculated as follows.

First, it is assumed that only a (1−p) percentage of memory cells in a memory block are erased (That is, R=1−p).

In addition, it is assumed that $t_{(i)}$ (where, $0 \le t_{(1)} \le t_{(2)} \ldots t_{(N)}$) and that $M_n = t_{(n)}$. That is, Mn may be order statistics of $\{T_i\}_1^N$. In other words, $Z_N = M_N$.

According to extreme value theory, if $pN > 1+\epsilon$, $\forall_{\epsilon>0}$, the probability distribution function of $M_{(1-p)N}$ gradually becomes close to $F^{-1}(1-p)$. If $$p \gg \frac{1}{N},$$

the convergence of the probability distribution function is very fast.

To be more precise, the erase time may be set such that a percentage of memory cells which corresponds to a probability p are not erased. Then, the number of unerased cells may follow a binomial distribution of the probability p. If the binomial distribution is normalized, an average ratio is estimated to be p, and the standard deviation is estimated to be $$\sqrt{\frac{p(1-p)}{N}}.$$

That is, the standard deviation is reduced according to $N^{-1/2}$, and this is faster than $(\ln N)^{-1/2}$.

The average erase time of the present inventive concept is given by Equation (7).

$$T_E = \mu + Q^{-1}(p)\sigma \approx \mu + \sqrt{-2\ln p}\sigma \quad [7]$$

Figure 8:
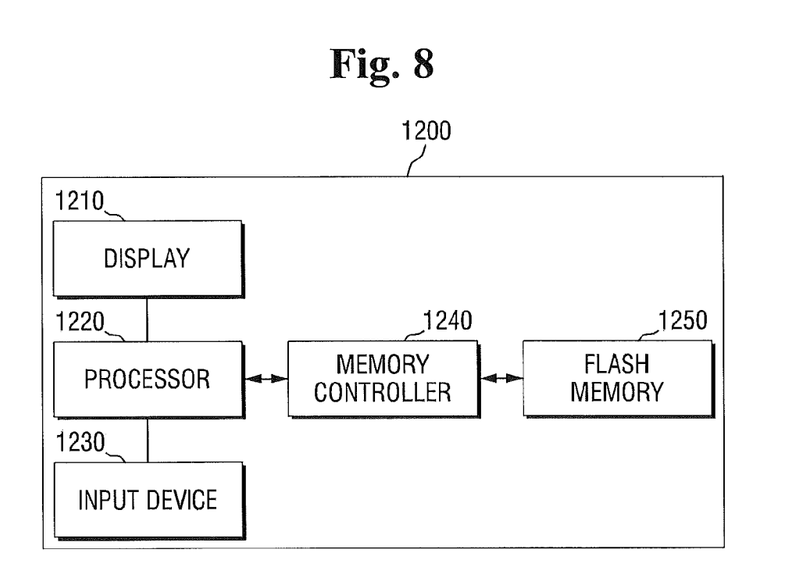

Since $$p \gg \frac{1}{N},$$

the average erase time of the present inventive concept is given by Equation (8), as compared with the average erase time (in the case where 'all memory cells must be erased until the end of an erase operation') of Equation (6). In particular, an average gain of the present inventive concept is shown in FIG. 8), as compared with Equation (6). When $\mu \ll \sqrt{2\ln N}\sigma$, an upper bound of the average gain is calculated.

$$\overline{G} \approx \frac{\mu + \sqrt{2\ln N}\,\sigma}{\mu + \sqrt{-2\ln p}\,\sigma} \leq \sqrt{-\frac{\ln N}{\ln p}} \quad [8]$$

It can be understood from Equation (8) that the average erase time of the probabilistic erase is very short.

In the probabilistic erase, a plurality of memory cells (that is, stuck cells) that are not erased during an erase operation may be processed as side information. For example, it may be assumed that each memory cell has two voltage distributions P1 and P2 and that a probability of a memory cell becoming a stuck cell is p. In this case, if a-priori known information is used during a program operation based on information theory, the capacity of this channel is 1−p. Considering a typical p value, the capacity penalty is very small.

The side information may be used as follows. To minimize or reduce errors that may result from stuck cells, original data may be programmed into a plurality of memory cells, or inverted data of the original data may be written to the memory cells. That is, original data to be written to a plurality of memory cells is compared with data pre-stored in the memory cells. A first number may be the number of matches between the original data and the pre-stored data, and a second number may be the number of matches between inverted data of the original data and the pre-stored data. The first number and the second number are compared. If the first number is greater than the second number, the original data is written to a memory block. On the other hand, if the second number is greater than the first number, the inverted data is written to the memory block.

An additional bit is further written to the memory cells. The additional bit indicates whether data written to the memory cells is the original data or the inverted data. The additional bit may be, but is not limited to, 1 bit.

Figure 4:
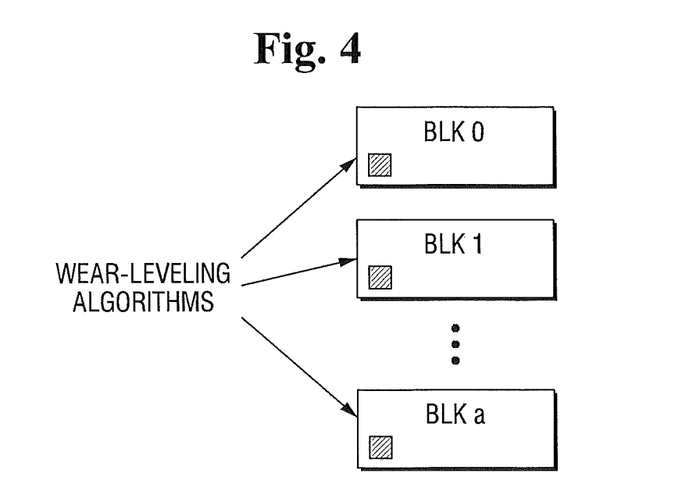
FIG. 4 is a diagram illustrating a method of driving a memory according to another embodiment of the present inventive concept.

FIG. 4 is a diagram illustrating methods of driving a memory according to further embodiments of the present inventive concept.

Referring to FIG. 4, the method of driving a memory according to the current embodiment may further adopt wear-leveling algorithms. The adoption of the wear-leveling algorithms may reduce the number of P/E cycles experienced by memory cells in a memory device, which may, in turn, result in increased endurance of the memory device.

A plurality of memory cells in a memory device may be divided into a plurality of memory blocks BLK0 through BLKa. In the wear-leveling algorithms, when data is programmed into the memory cells, it is written to the memory cells in view of leveling between the memory blocks BLK0 through BLKa.

For example, when 1 MB of data is programmed, it may not continuously be programmed into only one memory block (e.g., BLK0). Instead, the 1 MB of data may be programmed into the memory blocks BLK0 through BLKa in a distributed fashion. That is, in view of leveling, the 1 MB of data may be programmed into the memory block BLK0 or may be programmed into the memory block BLK1. The wear-leveling algorithms can reduce the damage to channel insulating films of the memory cells.

Figure 5:
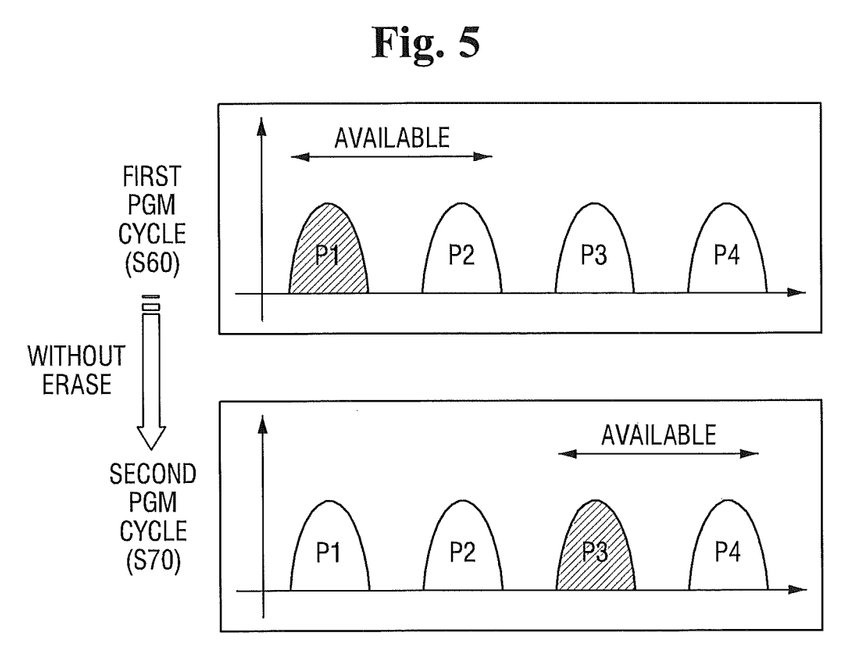
FIG. 5 is a diagram illustrating a method of driving a memory according to another embodiment of the present inventive concept.

FIG. 5 is a diagram illustrating a method of driving a memory according to further embodiments of the present inventive concept.

Referring to FIG. 5, the method of driving a memory according to the current embodiment may further adopt a stripping method. The adoption of the stripping method may reduce the number of P/E cycles to which the memory cells of a memory device may be subjected, which may, in turn, result in increased endurance of the memory device.

For example, in a first program cycle, two (P1 and P2) of four voltage distributions P1 through P4 are used. As shown in the drawing, logic 1 is programmed into the voltage level P1. In a second program cycle, the other two voltage distributions (P3 and P4) of the four voltage distributions P1 through P4 are used. As shown in the drawing, logic 1 is programmed into the voltage level P3.

In summary, when each memory cell includes C (where C is a natural number equal to or greater than three) writable voltage distributions, a first program operation is performed using B voltage distributions among the C voltage distributions, where B is a natural number smaller than C. Then, a second program operation is performed using the remaining (C-B) voltage distributions. Each memory cell may not be erased after the first program operation and before the second program operation.

When the stripping method is used, channel insulating films of memory cells are damaged much less than in regular programming (since the number of erase operations is reduced).

Figure 6:
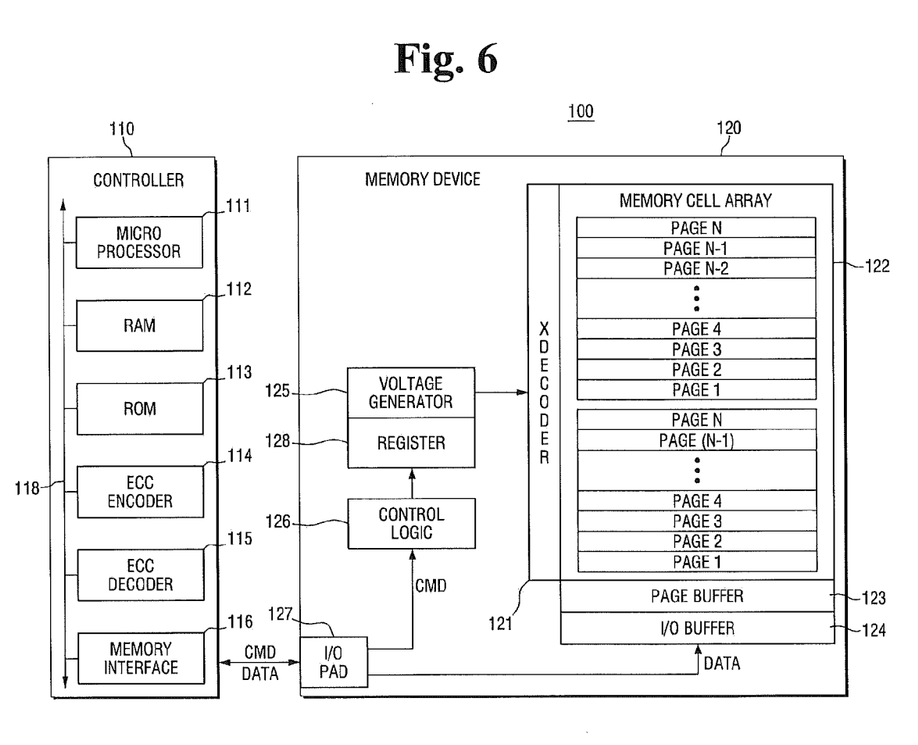
FIG. 6 is a block diagram of a memory system to which a memory according to some embodiments of the present inventive concept is applied.

FIG. 6 is a block diagram of a memory system to which a memory according to some embodiments of the present inventive concept is applied.

Referring to FIG. 6, the memory system 100 includes the memory controller 110 and a nonvolatile memory device 120.

The nonvolatile memory device 120 may be, but is not limited to, a NAND flash memory device. The nonvolatile memory device 120 may include a plurality of NAND flash memory devices. The nonvolatile memory device 120 may have a planar structure or a three-dimensional (3D) memory cell structure with a stack of memory cells.

The nonvolatile memory device 120 may include a memory cell array 122, an X decoder 121, a voltage generator 125, an input/output (I/O) pad 127, an I/O buffer 124, a page buffer 123, and a control logic 126.

The memory cell array 122 includes a plurality of word lines W/L and a plurality of bit lines B/L. Each memory cell may be implemented as a memory cell having a floating gate or a charge storage layer such as a charge trapping layer.

The memory cell array 122 may include a plurality of blocks and a plurality of pages. One block includes a plurality of pages. A page may be a unit of program and read operations, and a block may be a unit of erase operation.

The control logic 126 controls the overall operation of the nonvolatile memory device 120. When receiving a command CMD from the memory controller 110, the control logic 126 interprets the command CMD and controls the nonvolatile memory device 120 to perform an operation (e.g., a program operation, a read operation, a read retry operation, or an erase operation) according to the interpreted command CMD.

The X decoder 121 is controlled by the control logic 126 and drives at least one of the word lines W/L in the memory cell array 122 according to a row address.

The voltage generator 125 is controlled by the control logic 126 to generate one or more voltages required for a program operation, a read operation or an erase operation and provide the generated voltages to one or more rows selected by the X decoder 121.

A register 128 is a space in which information input from the memory controller 110 is stored and may include a plurality of latches. For example, the register 128 may group read voltage information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 110 or a host and the nonvolatile memory device 120.

The memory controller 110 may include a microprocessor 111, a read-only memory (ROM) 113, a random access memory (RAM) 112, an error checking code (ECC) decoder 114, an ECC encoder 114, a memory interface 116, and a bus 118. The elements 111 through 116 of the memory controller 110 may be electrically connected to each other through the bus 118.

The microprocessor 111 controls the overall operation of the memory system 100 including the memory controller 110. When power is supplied to the memory system 100, the microprocessor 111 drives firmware (stored in the ROM 113) for operating the memory system 100 on the RAM 112, thereby controlling the overall operation of the memory system 100.

While a driving firmware code of the memory system 100 is stored in the ROM 113, the scope of the present inventive concept is not limited thereto. The firmware code can also be stored in the nonvolatile memory device 120 other than the ROM 113. Therefore, the control or intervention of the microprocessor 111 may encompass not only the direct control of the microprocessor 111 but also the intervention of firmware which is software driven by the microprocessor 111.

The RAM 112, which is a memory serving as a buffer, may store an initial command, data, and various variables input from the host or data output from the nonvolatile memory device 120. The RAM 112 may store data and various parameters and variables input to and output from the nonvolatile memory device 120.

The memory interface 116 may serve as an interface between the memory controller 110 and the nonvolatile memory device 120. The memory interface 116 is connected to the I/O pad 127 of the nonvolatile memory device 120 and may exchange data with the I/O pad 127. In addition, the memory interface 116 may create a command suitable for the nonvolatile memory device 120 and provide the created command to the I/O pad 127 of the nonvolatile memory device 120. The memory interface 116 provides a command to be executed by the nonvolatile memory device 120 and an address ADD of the nonvolatile memory device 120.

The ECC decoder 115 and the ECC encoder 114 perform error bit correction. The ECC encoder 114 generates data added with a parity bit by performing error correction encoding on data provided to the nonvolatile memory device 120. The parity bit may be stored in the nonvolatile memory device 120.

The ECC decoder 115 performs error correction decoding on output data, determines whether the error correction decoding is successful based on the result of the error correction decoding, and outputs an instruction signal based on the determination result. Read data may be transmitted to the ECC decoder 115, and the ECC decoder 115 may correct error bits of the data using the parity bit. When the number of error bits exceeds a limit of error bits that can be corrected, the ECC decoder 115 cannot correct the error bits, resulting in error correction failure. The ECC encoder 114 and the ECC decoder 115 may perform error correction using, but not limited to, low density parity check (LDPC) code, BCH code, turbo code, Reed-Solomon code, convolution code, recursive systematic code (RSC), or coded modulation such as trellis-coded modulation (TCM) or block coded modulation (BCM).

Each of the ECC encoder 114 and the ECC decoder 115 may include an error correction circuit, system or device.

Referring to FIG. 6, the memory system 120 or memory controller 110 may perform the probabilistic erase described above with reference to FIGS. 1 through 5.

The memory system 120 or memory controller 110 may erase a plurality of memory cells of a nonvolatile memory device 120 and test whether the memory cells have been erased. If more than a predetermined percentage of the memory cells have been erased, the memory controller 110 may not erase the memory cells again.

The memory system 120 or memory controller 110 may erase the memory cells on a memory block-by-memory block basis. If a preset number of memory cells in a memory block have been erased, the memory controller 110 may process this case as erase success.

In addition, the memory system 120 or memory controller 110 may read data from incompletely erased memory cells (that is, stuck cells) and correct the read data.

The memory system 100 or memory controller 110 may program data into the memory cells of the nonvolatile memory device 120 in view of leveling between memory blocks.

Alternatively, if each memory cell includes K writable voltage distributions (K is a natural number equal to or greater than three), the memory controller 110 may perform a first program operation using M voltage distributions among the K voltage distributions, where M is a natural number smaller than K. In addition, the memory controller 110 may perform a second program operation using (K−M) voltage distributions. There can be more than two programming operations when using the stripping method. If M levels are programmed every programming operation, and there are K levels, then (K−M)/(M−1)+1 program operations can be performed without performing an erase.

Alternatively, the memory controller 110 may compare original data to be written to the memory cells and data pre-stored in the memory cells. Based on the comparison result, the memory controller 110 may program the original data to the memory cells or program inverted data of the original data to the memory cells.

Figure 7:
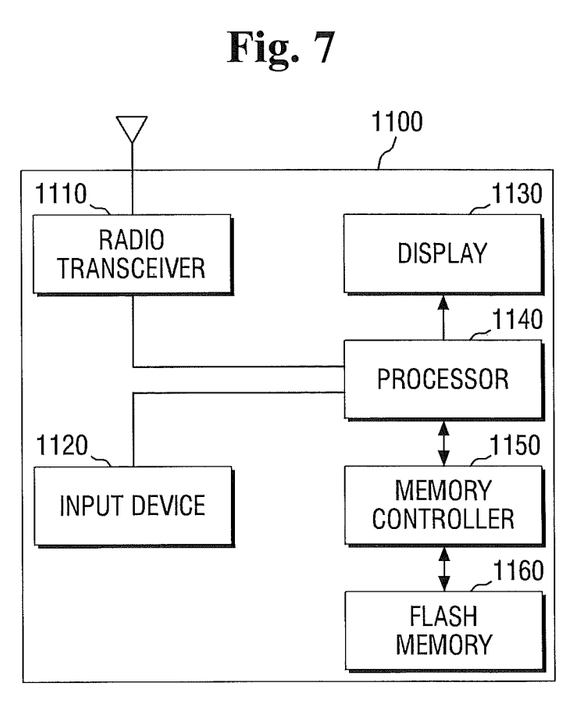
FIGS. 7 through 12 are block diagrams of electronic devices, each including a memory according to some embodiments of the present inventive concept.

FIG. 7 is a block diagram of an electronic device 1100 including a the memory system or memory controller according to some embodiments of the present inventive concept.

Referring to FIG. 7, the electronic device 1100 may be a cellular phone, a smart phone or a table personal computer (PC). The electronic device 1100 may include a nonvolatile memory device 1160 which can be implemented as a flash memory device and a memory controller 1150 which can control the operation of the nonvolatile memory device 1160.

The memory controller 1150 may be the memory controller 110 shown in FIG. 6.

The memory controller 1150 is controlled by a processor 1140 which may control the overall operation of the electronic device 1100.

The memory controller 1150 which is controlled by the processor 1140 may control data stored in the nonvolatile memory device 1160 to be displayed on a display 1130.

A radio transceiver 1110 may receive or transmit radio signals through an antenna ANT. For example, the radio transceiver 1110 may convert a radio signal received through the antenna ANT into a signal that can be processed by the processor 1140. Therefore, the processor 1140 may process the signal output from the radio transceiver 1110 and store the processed signal in the nonvolatile memory device 1160 via the memory controller 1150 or display the processed signal on the display 1130.

The radio transceiver 1110 may convert a signal output from the processor 1110 into a radio signal and transmit the radio signal through the antenna ANT.

An input device 1120 is a device by which a control signal for controlling the operation of the processor 1140 or data to be processed by the processor 1140 can be input. The input device 1120 may be implemented as a pointing device such as a touchpad or computer mouse, a keypad, or a keyboard.

The processor 1140 may control the display 1130 to display data output from the nonvolatile memory device 1160, a radio signal output from the radio transceiver 1110, or data output from the input device 1120.

FIG. 8 is a block diagram of an electronic device 1200 including a the memory system or memory controller according to some embodiments of the present inventive concept.

Referring to FIG. 8, the electronic device 1200 may be a data processor such as a PC, a table computer, a net-book, an e-reader, a personal digital assistant (PDA), a portable multimedia player (PMP), an MP3 player, or an MP4 player. The electronic device 1200 may include a nonvolatile memory device 1250 such as a flash memory device and a memory controller 1240 which can control the operation of the nonvolatile memory device 1250.

The memory controller 1240 may be the memory controller 110 shown in FIG. 6. The electronic device 1200 may include a processor 1220 for controlling the overall operation of the electronic device 1200. The memory controller 1240 is controlled by the processor 1220.

In response to an input signal generated by an input device 1230, the processor 1220 may display data stored in the nonvolatile memory device 1250 on a display 1210. The input device 1230 may be, for example, a pointing device such as a touchpad or a computer mouse, a keypad, or a keyboard.

Figure 9:
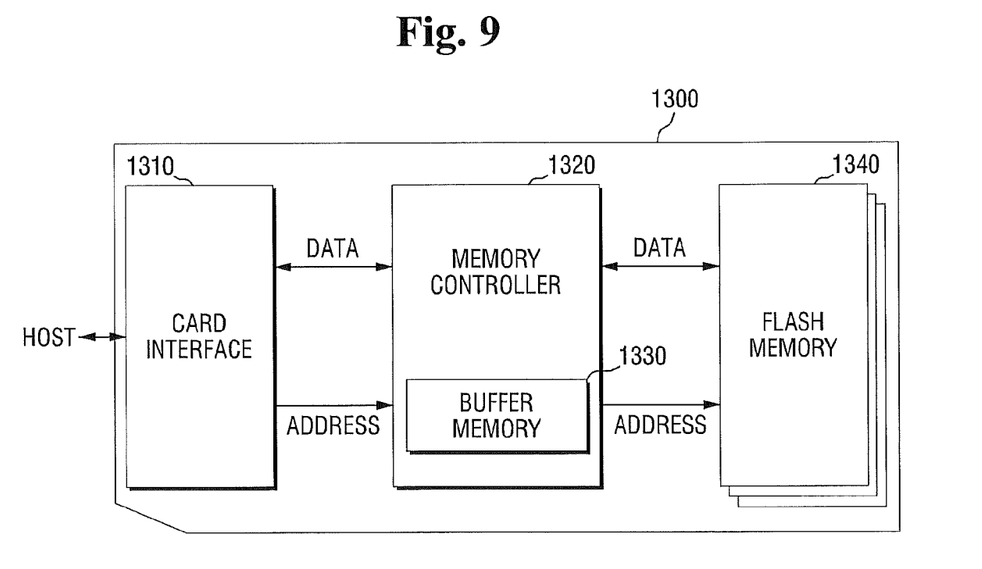

FIG. 9 is a block diagram of an electronic device 1300 including the memory system or memory controller according to some embodiments of the present inventive concept.

Referring to FIG. 9, the electronic device 1300 includes a card interface 1310, a memory controller 1320, and a nonvolatile memory device 1340 (e.g., a flash memory device).

The electronic device 1300 may exchange data with a host HOST through the card interface 1310. Depending on embodiments, the card interface 1310 may be, but is not limited to, a secure digital (SD) card interface or a multimedia card (MMC) interface. The card interface 1310 may interface data exchange between the host HOST and the memory controller 1320 according to a communication protocol of the host HOST which can communicate with the electronic device 1300.

The memory controller 1320 controls the overall operation of the electronic device 1300 and controls data exchange between the card interface 1310 and the nonvolatile memory device 1340. In addition, a buffer memory 1330 of the memory controller 1320 may buffer data exchanged between the card interface 1310 and the nonvolatile memory device 1340.

The memory controller 1320 is connected to the card interface 1310 and the nonvolatile memory device 1340 through a data bus DATA and an address bus ADDRESS. Depending on embodiments, the memory controller 1320 may receive an address of data to be read or written from the card interface 1310 through the address bus ADDRESS and transmit the received address to the nonvolatile memory device 1340.

The memory controller 1320 receives or transmits data to be read or written through the data bus DATA which is connected to each of the card interface 1310 and the nonvolatile memory device 1340. The memory controller 1320 may be the memory controller 110 shown in FIG. 6.

When the electronic device 1300 of FIG. 9 is connected to the host HOST such as a PC, a table PC, a digital camera, a digital audio player, a mobile phone, console video game hardware or a digital settop box, the host HOST may receive data stored in the nonvolatile memory device 1340 or transmit data to be stored in the nonvolatile memory device 1340 through the card interface 1310 and the memory controller 1320.

Figure 10:
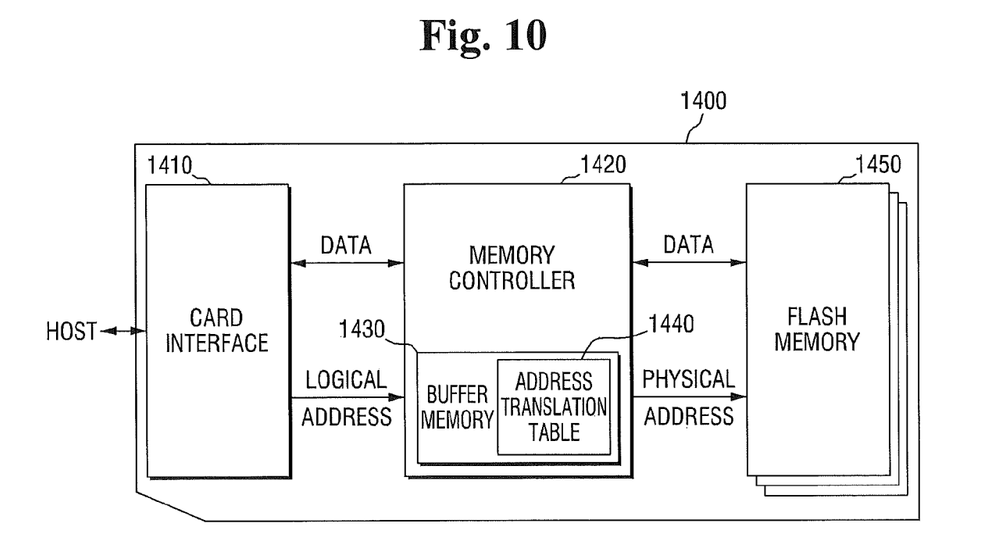

FIG. 10 is a block diagram of an electronic device 1400 including the memory system or memory according to some embodiments of the present inventive concept.

Referring to FIG. 10, the electronic device 1400 includes a card interface 1410, the memory controller 1420, and a nonvolatile memory device 1450 (e.g., a flash memory device).

The electronic device 1400 may perform data communication with a host HOST through the card interface 1410. Depending on embodiments, the card interface 1410 may be, but is not limited to, an SD card interface or an MMC interface. The card interface 1410 may perform data communication between the host HOST and the memory controller 1420 according to a communication protocol of the host HOST which can communicate with the electronic device 1400.

The memory controller 1420 may control the overall operation of the electronic device 1400 and control data exchange between the card interface 1410 and the nonvolatile memory device 1450.

A buffer memory 1430 included in the memory controller 1420 may store various data for controlling the overall operation of the electronic device 1400. The memory controller 1420 may be connected to the card interface 1410 and the nonvolatile memory device 1450 through a data bus DATA and a logical address bus LOGICAL ADDRESS.

Depending on embodiments, the memory controller 1420 may receive an address of read data or program data from the card interface 1410 through the logical address bus LOGICAL ADDRESS and transmit the received address to the nonvolatile memory device 1450 through a physical address bus PHYSICAL ADDRESS.

In addition, the memory controller 1420 may receive or transmit read data or program data through a data bus DATA which is connected to each of the card interface 1410 and the nonvolatile memory device 1450. The memory controller 1420 may be the memory controller 110 shown in FIG. 6.

Depending on embodiments, the memory controller 1420 of the electronic device 1400 may include an address translation table 1440 in the buffer memory 1430. The address translation table 1440 may include a logical address input from an external source and a logical address for accessing the nonvolatile memory device 1450. During a program operation, the memory controller 1420 may program new data to a physical address and update the address translation table 1440.

The memory controller 1420 may select from the address translation table 1440 a physical address at which both a read operation and a program operation can be performed by referring to a physical address of data being written.

The memory controller 1420 may perform both the program operation and the read operation and update the address translation table 1440 according to the program operation and the read operation. Therefore, the operating time of the electronic device 1400 can be reduced.

When the electronic device 1400 of FIG. 10 is connected to the host HOST such as a PC, a table PC, a digital camera, a digital audio player, a mobile phone, console video game hardware or a digital settop box, the host HOST may receive data stored in the nonvolatile memory device 1450 or transmit data to be stored in the nonvolatile memory device 1450 through the card interface 1410 and the memory controller 1420.

Figure 11:
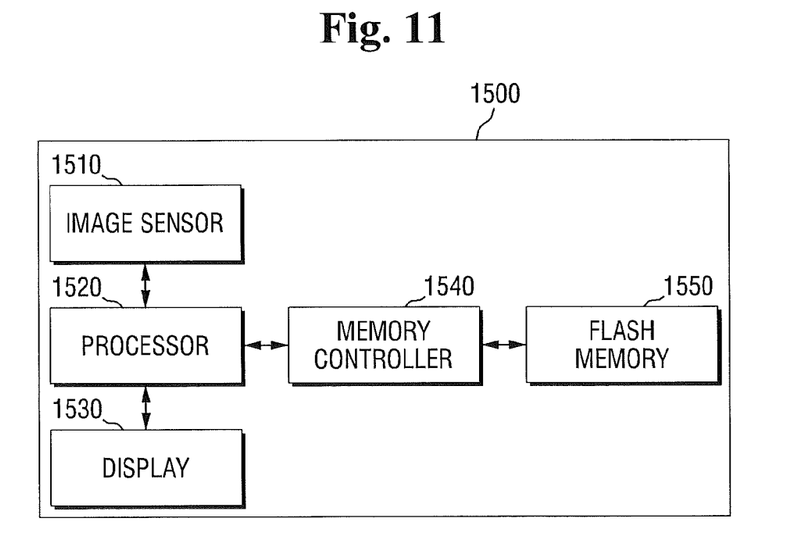

FIG. 11 is a block diagram of an electronic device 1500 including the memory system or memory according to some embodiments of the present inventive concept.

Referring to FIG. 11, the electronic device 1500 includes a nonvolatile memory device 1550 such as a flash memory device, a memory controller 1540 which controls the data processing operation of the nonvolatile memory device 1550, and a processor 1520 which controls the overall operation of the electronic device 1500. The memory controller 1540 may be the memory controller 110 shown in FIG. 6.

An image sensor 1510 of the electronic device 1500 converts an optical signal into a digital signal, and the digital signal is stored in the nonvolatile memory device 1550 or displayed on a display 1530 under the control of the processor 1520. The digital signal stored in the nonvolatile memory device 1550 is displayed on the display 1530 under the control of the processor 1520.

Figure 12:
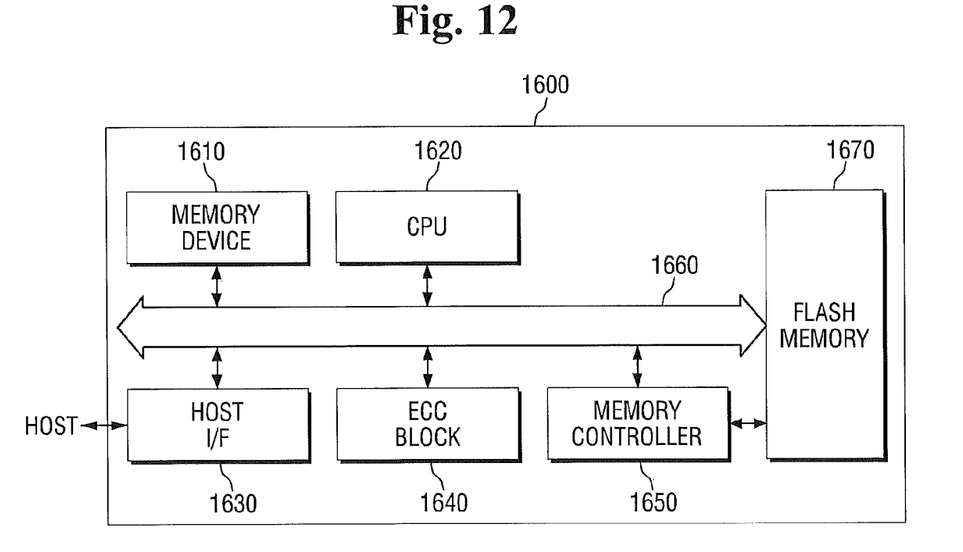

FIG. 12 is a block diagram of an electronic device 1600 including the memory system or memory according to some embodiments of the present inventive concept.

Referring to FIG. 12, the electronic device 1600 includes a nonvolatile memory device 1670 such as a flash memory device, a memory controller 1650 which controls the operation of the nonvolatile memory device 1670, and a central processing unit (CPU) 1620 which controls the overall operation of the electronic device 1600.

The electronic device 1600 includes a memory device 1610 that can be used as an operation memory of the CPU 1620. The memory device 1610 may be implemented as a nonvolatile memory such as a ROM or a volatile memory such as a dynamic RAM (DRAM).

A host HOST connected to the electronic device 1600 may exchange data with the nonvolatile memory device 1670 through the memory controller 1650 and a host interface 1630. Here, the memory controller 1650 may function as a memory interface, for example, a flash memory interface. The memory controller 1650 may be the memory controller 110 shown in FIG. 6.

Depending on embodiments, the electronic device 1600 may further include an ECC block 1640. The ECC block 1640 controlled by the CPU 1620 may detect and correct an error included in data read from the nonvolatile memory device 1670 through the memory controller 1650.

The CPU 1620 may control data exchange between the memory controller 1650, the ECC block 1640, the host interface 1630, and the memory device 1610 through a bus 1660. The electronic device 1600 may be implemented as a universal serial bus (USB) memory drive or a memory stick.

What is claimed is:

1. A method of driving a memory device, the method comprising:

erasing a plurality of memory cells of the memory device wherein each of the memory cells comprises a plurality of writable voltage distributions, and wherein the memory cells are erased using an erase pulse having a pulse time that is selected to erase less than all of the writable voltage distributions;

checking whether the memory cells have been erased;

determining that more than a predetermined percentage of the memory cells but less than all of the memory cells were erased; and programming data into the memory cells of the memory device without performing an intervening erase operation on the plurality of memory cells in response to the determination that more than the predetermined percentage of the memory cells but less than all of the memory cells were erased.

2. The method of claim 1, wherein the memory cells are divided into a plurality of memory blocks, and wherein programming the data into the memory cells comprises writing the data to the memory cells in response to leveling between the memory blocks.

3. The method of claim 1, wherein each of the memory cells comprises K writable voltage distributions, and wherein programming the data into the memory cells comprises performing a first program operation using M voltage distributions among the K writable voltage distributions and performing a second program operation using (K−M) voltage distributions, wherein K is a natural number equal to or greater than three, and M is a natural number smaller than K.

4. The method of claim 1, wherein programming the data into the memory cells comprises comparing original data to be written to the memory cells with data pre-stored in the memory cells and writing the original data to the memory cells or writing inverted data of the original data to the memory cells based on the comparison result.

5. The method of claim 4, wherein a first number of matches between the original data and the pre-stored data and a second number of matches between the inverted data and the pre-stored data are compared, and the inverted data is written to the memory blocks if the second number is greater than the first number.

6. The method of claim 4, further comprising writing to the memory cells at least one additional bit which indicates whether data written to the memory cells is the original data or the inverted data.

7. The method of claim 1, wherein the memory cells are flash memory cells, wherein erasing the memory cells comprises erasing the memory cells on a memory block-by-memory block basis, and wherein the predetermined percentage of the memory cells comprises a predetermined number of memory cells in each of the memory blocks.

8. The method of claim 1, further comprising reading data from un-erased memory cells and correcting the read data.

9. The method of claim 1, wherein the predetermined percentage is programmed into the memory device after its manufacture.

10. A method of driving a memory device having a plurality of permissible programmed voltage distribution levels, the method comprising:

applying an erase voltage to erase a plurality of memory cells of the memory device, wherein the erase voltage has a pulse time and/or a voltage level that is selected to erase upper voltage distribution levels of the plurality of permissible programmed voltage distribution levels but not to erase lower voltage distribution levels of the plurality of permissible programmed voltage distribution levels; and programming data into the upper voltage distribution levels of the memory cells after applying the erase voltage.

11. The method of claim 10, further comprising programming data into the memory cells of the memory device.

12. The method of claim 11, wherein the memory cells are divided into a plurality of memory blocks, and wherein programming the data into the memory cells comprises writing the data to the memory cells in response to leveling between the memory blocks.

13. The method of claim 11, wherein each of the memory cells comprises K writable voltage distributions, and wherein programming the data into the memory cells comprises performing a first program operation using M voltage distributions among the K writable voltage distributions and performing a second program operation using (K−M) voltage distributions, wherein K is a natural number equal to or greater than three, and M is a natural number smaller than K.

14. The method of claim 12, wherein programming the data into the memory cells comprises comparing original data to be written to the memory cells with data pre-stored in the memory cells and writing the original data to the memory cells or writing inverted data of the original data to the memory cells based on the comparison result.

15. A method of driving a memory device, the method Comprising:
   applying an erase voltage to erase a plurality of memory cells of the memory device, each of the plurality of memory cells having a plurality of permissible programmed voltage distribution levels, wherein the erase voltage has a pulse time and/or a voltage level that is selected to erase less than all of the plurality of permissible programmed voltage distribution levels of the memory cells;
   programming data into the plurality of memory cells; and
   correcting errors in the data programmed into the plurality of memory cells using an error correcting code;
   wherein programming the data into the memory cells comprises comparing original data to be written to the memory cells with data pre-stored in the memory cells and writing the original data to the memory cells or writing inverted data of the original data to the memory cells based on the comparison result.

16. The method of claim 15, wherein a first number of matches between the original data and the pre-stored data and a second number of matches between the inverted data and the pre-stored data are compared, and the inverted data is written to the memory blocks if the second number is greater than the first number.

17. The method of claim 15, further comprising writing to the memory cells at least one additional bit which indicates whether data written to the memory cells is the original data or the inverted data, 18. The method of claim 15, wherein each of the memory cells comprises K writable voltage distributions, and wherein programming the data into the memory cells comprises performing a first program operation using M voltage distributions among the K writable voltage distributions and performing a second program operation using (K−M) voltage distributions, wherein K is a natural number equal to or greater than three, and M is a natural number smaller than K.

* * * * *